United States Patent
Liu et al.

(10) Patent No.: US 10,475,892 B2
(45) Date of Patent: Nov. 12, 2019

(54) TUNNELING FIELD EFFECT TRANSISTOR AND METHOD OF FABRICATING THE SAME

(71) Applicant: UNITED MICROELECTRONICS CORP., Hsin-Chu (TW)

(72) Inventors: An-Chi Liu, Tainan (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/172,851

(22) Filed: Oct. 28, 2018

(65) Prior Publication Data

US 2019/0067433 A1 Feb. 28, 2019

Related U.S. Application Data

(62) Division of application No. 15/674,526, filed on Aug. 11, 2017, now Pat. No. 10,147,795.

(51) Int. Cl.
| | |
|---|---|
| *H01L 29/423* | (2006.01) |
| *H01L 29/20* | (2006.01) |
| *H01L 29/417* | (2006.01) |
| *H01L 29/49* | (2006.01) |
| *H01L 29/66* | (2006.01) |
| *H01L 29/78* | (2006.01) |
| *H01L 29/739* | (2006.01) |

(52) U.S. Cl.
CPC ........ *H01L 29/42356* (2013.01); *H01L 29/20* (2013.01); *H01L 29/41741* (2013.01); *H01L 29/49* (2013.01); *H01L 29/66666* (2013.01); *H01L 29/7391* (2013.01); *H01L 29/7827* (2013.01)

(58) Field of Classification Search
None
See application file for complete search history.

(56) References Cited

U.S. PATENT DOCUMENTS

| | | |
|---|---|---|
| 9,293,591 B2 | 3/2016 | Lee |
| 9,466,714 B2 | 10/2016 | Chuang |
| 2008/0224224 A1 | 9/2008 | Vandenderghe |
| 2009/0032820 A1 | 2/2009 | Chen |
| 2013/0093497 A1* | 4/2013 | Lee ............... H01L 29/78609 327/420 |
| 2014/0291775 A1 | 10/2014 | Oka |
| 2016/0155842 A1* | 6/2016 | Masuoka ........... H01L 21/225 257/329 |

(Continued)

*Primary Examiner* — Khaja Ahmad
(74) *Attorney, Agent, or Firm* — Winston Hsu

(57) ABSTRACT

A method for forming a tunneling field effect transistor is disclosed, which includes the following steps. First, a semiconductor substrate is provided. A source region is formed on the semiconductor substrate. A tunneling region having a sidewall and a top surface is formed on the source region. A drain region is formed on the tunneling region. A gate dielectric layer is then formed, covering the sidewall and the top surface of the tunneling region. A first metal layer is formed, covering the gate dielectric layer. Subsequently, an anisotropic etching process is performed to remove a portion of the first metal layer. After the anisotropic etching process, a second metal layer is fabricated to cover the remaining first metal layer and the gate dielectric layer.

8 Claims, 5 Drawing Sheets

(56) References Cited

U.S. PATENT DOCUMENTS

2016/0218211 A1\* 7/2016 Yuan ................ H01L 29/66356
2016/0293756 A1   10/2016 Liu
2017/0213836 A1\* 7/2017 Zhang ................ H01L 29/1033

\* cited by examiner

TUNNELING FIELD EFFECT TRANSISTOR AND METHOD OF FABRICATING THE SAME

CROSS REFERENCE TO RELATED APPLICATIONS

This is a division of U.S. application Ser. No. 15/674,526, filed on Aug. 11, 2017, which is incorporated herein by reference in its entirety.

BACKGROUND OF THE INVENTION

1. Field of the Invention

The present invention generally relates to a tunneling field effect transistor (TFET). More particularly, the present invention relates to a vertical-type tunneling field effect transistor and a method of fabricating the same.

2. Description of the Prior Art

In the past decades, semiconductor integrated circuit (IC) industry has developed rapidly. The advancement of semiconductor materials and manufacturing technology allows ICs to contentiously shrink with increased complexity and improved performance. More semiconductor devices having smaller feature sizes may be formed within a unit area of a semiconductor substrate to achieve a higher integrity. However, it adversely results in some technological problems. For example, closely arranged semiconductors devices may have larger leakage current and obvious signal interference. Furthermore, power consumption is also a primary concern in advanced technology.

Tunneling field effect transistors (TFETs) have been proposed to take the place of conventional metal-oxide semiconductor field effect transistors (MOSFETs) in some applications confronted with the aforesaid problems. TFETs are advantageous over conventional MOSFETs in the respects of smaller sub-threshold swing (for example, smaller than 60 mV/dec), larger on-off current ratio (Ion/Ioff) and smaller off-state leakage current (Ioff).

However, there are still some problems in existing TFETs. For example, the on-state current (Ion) of a TFET is too low for certain application and the sub-threshold swing of a TFET still need further improvement.

SUMMARY OF THE INVENTION

In light of the above, the present invention is directed to provide an improved tunneling field effect transistor (TFET) which may overcome the aforesaid technical problems of existing tunneling field effect transistors.

According to one embodiment of the present invention, a tunneling field effect transistor (TFET) is disclosed. The TFET according to the present invention comprises a semiconductor substrate, a source region, a tunneling region, a gate electrode and a gate dielectric layer. The source region is disposed on the semiconductor substrate. The tunneling region is disposed on the source region and has a sidewall and a top surface. The drain region is disposed on the tunneling region. The gate dielectric layer is disposed between the gate electrode and the tunneling region. The gate electrode is disposed on the source region and the tunneling region and has a first gate electrode and a second gate electrode, wherein the first gate electrode is disposed on the sidewall of the tunneling region, and the second gate electrode is disposed on the top surface of the tunneling region. The composition of the first gate electrode is different from the composition of the second gate electrode.

According to another embodiment of the present invention, a method for forming a tunneling field effect transistor is disclosed, which comprises the following steps. First, a semiconductor substrate is provided. A source region is formed on the semiconductor substrate. A tunneling region having a sidewall and a top surface is formed on the source region. A drain region is formed on the tunneling region. A gate dielectric layer is then formed, covering the sidewall and the top surface of the tunneling region. A first metal layer is formed, covering the gate dielectric layer. Subsequently, an anisotropic etching process is performed to remove a portion of the first metal layer. After the anisotropic etching process, a second metal layer is fabricated to cover the remaining first metal layer and the gate dielectric layer.

In some embodiments, the composition of the first gate electrode includes at least one more kind of atom compared with the composition of the second gate electrode.

In some embodiments, the work function of the first gate electrode is less than the work function of the second gate electrode.

In some embodiments, the source region is a heavily doped region having a first conductivity type, the tunneling region is a doped region having a second conductivity type, and the drain region is a heavily doped region having the first conductivity type.

In some embodiments, the source region, the tunneling region and the drain region are made of group III-V semiconductor compounds.

In some embodiments, the first conductivity type is P type, and the second conductivity type is N type.

In some embodiments, the tunneling field effect transistor according to the present invention further comprises a channel region disposed between the tunneling region and the drain region. The channel region and the tunneling region have the same conductivity type but different dopant concentrations and/or dopant species.

In some embodiments, the TFET further comprises a third gate electrode disposed on the sidewall of the drain region, wherein the composition of the third gate electrode is the same as the composition of the first gate electrode.

In some embodiments, the channel region has a step-shaped structure, and the third gate electrode is disposed on a sidewall of the step-shaped structure.

In some embodiments, the gate electrode comprises a first gate electrode, a second gate electrode and a third gate electrode. The first gate electrode is disposed on a sidewall of the tunneling region. The second gate electrode is disposed on a top surface of the channel region and in direct contact with the first gate electrode, wherein the first gate electrode and the second gate electrode have different compositions. The third gate electrode is disposed on a sidewall of the drain region and is spaced apart from the first gate electrode by the second gate electrode. The composition of the third gate electrode is the same as the composition of the first gate electrode.

In some embodiments, the first metal layer is a contentious layer and conformally covers the gate dielectric layer before the anisotropic etching process.

In some embodiments, the first metal layer is a non-continuous layer after the anisotropic etching process.

In some embodiments, a thermal process is performed after depositing the second metal layer on the first metal layer to diffuse the metal atoms of the first metal layer into the second metal layer.

In some embodiments, the composition of the first metal layer is different from the composition of the second metal layer.

In some embodiments, the first metal layer is in direct contact with the second metal layer.

It is one feature of the present invention that the tunneling field effect transistors as illustrated in the various embodiments have a first gate electrode formed adjacent to the interface between the source region and the tunneling region, and have a second gate electrode distanced from the said interface. By forming the first gate electrode having a work function smaller than the work function of the second gate electrode, the lowest electron energy of the conduction band of the tunneling region is lowered to be closer to the valance band of the source region. Accordingly, when the tunneling field effect transistor is at on-state, the electrons from the valance band of the source region are readily able to tunnel through the interface between the source region and the tunneling region. An improved on-current (Ion) is therefore achieved.

It is another feature of the present invention that the entirety first metal layer is patterned by performing the anisotropic etching process, wherein the position of the remaining first metal layer determines the position of the first gate electrode. Since the position of the remaining first metal layer is formed self-aligned with the interface between the source region and the tunneling region, the position of the first gate electrode may be better controlled.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

Figure 1:
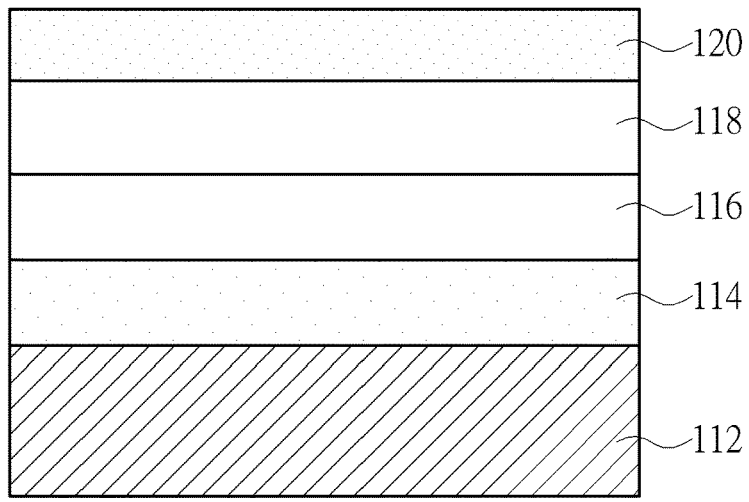
FIG. 1 is a cross-sectional diagram illustrating a TFET in the beginning of a series of successive fabricating steps according to one embodiment of the present invention.

Please refer to FIG. 1, which is a cross-sectional diagram illustrating a TFET in the beginning of a series of successive fabricating steps according to one embodiment of the present invention. As shown in FIG. 1, a stacked structure comprising, from bottom to top, a semiconductor substrate 112, a source region 114, a tunneling region 116, a channel region 118 and a drain region 120 are provided.

The semiconductor substrate 112 may be a silicon substrate or a Group III-V semiconductor substrate. According to a preferred embodiment, the semiconductor substrate 112 is a substrate having a Group III-V epitaxial semiconductor compound or semiconductor alloy formed thereon. For example, the semiconductor substrate 112 may be, but is not limited to, a sapphire substrate on which a semiconductor compound such as SiGe, GaAsP, GaAs, AlGaAs, InGaAs, AlGaAsSb, InGaAsSb or a semiconductor alloy may be epitaxially grown thereon.

The source region 114, the tunneling region 116, the channel region 118 and the drain region 120 are preferably Group III-V semiconductor compounds. More preferably, the source region 114, the tunneling region 116, the channel region 118 and the drain region 120 are Group III-V semiconductor compounds particularly having small energy band gap, for example, smaller than 0.75 eV or 0.5 eV, but is not limited thereto. The source region 114 is a heavily doped region having a first conductivity type, having a dopant concentration larger than 1E1019/cm3, but is not limited thereto. The tunneling region 116 is a heavily doped region or a doped region having a second conductivity type. The dopant concentration of the tunneling region 116 may be larger than 1E1019/cm3, but is not limited thereto. The channel region 118 is a doped region having the second conductivity type. The dopant concentration of the channel region 118 may be smaller than 1E1013/cm3, but is not limited thereto. The drain region 120 is a heavily doped region having the second conductivity type. The dopant concentration of the drain region 120 may be larger than 1E1019/cm3, but is not limited thereto. The thickness of the tunneling region 116 is smaller than the thickness of the channel region 118. In a preferred embodiment, the thickness of the tunneling region 116 is less than the thicknesses of the source region 114, the channel region 118 and the drain region 120, respectively.

According to an embodiment, the first conductivity type is P type and the second conductivity type is N type. For example, the source region 114 may be a P+ AlGaAs region, the tunneling region 116 may be an N+ InGaAs region, the channel region 118 may be an N– AlGaAs region, and the drain region 120 may be an N+ AlGaAs region, but is not limited thereto.

It should be noticed that the concentrations of dopants in the source region 114, the tunneling region 116, the channel region 118 and the drain region 120 may be individually controlled during their respective epitaxial growing processes. An additional implantation process may be performed after their respective epitaxial growing process to further adjust the dopant concentrations.

Figure 2:
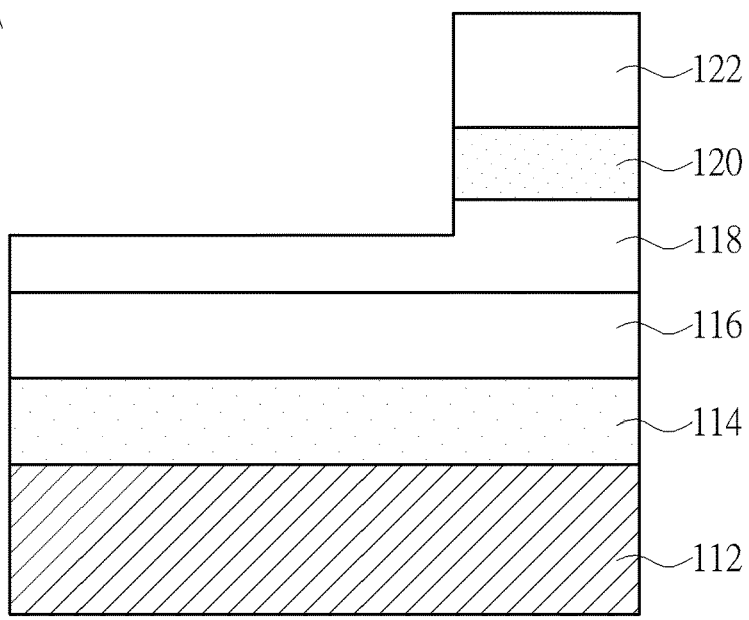
FIG. 2 is a cross-sectional diagram illustrating a TFET after the step of etching a channel layer of the TFET according to one embodiment of the present invention.

Please refer to FIG. 2, which is a cross-sectional diagram illustrating a TFET after the step of etching a channel layer of the TFET according to one embodiment of the present invention. As shown in FIG. 2, after forming a patterned mask 122 on the drain region 12, an etching process using the patterned mask 122 as an etching mask is performed to etch away a portion of the drain region 120 and the channel region 118, thereby transferring the pattern of the patterned mask 122 to the drain region 120 and the channel region 118 successively. The patterned mask 122 may be, for example, a patterned photoresist. According to the embodiment, the etching process may form a step-shaped structure having a step-height on the top surface of the channel region 118. According to various embodiments, the etching process may only remove the drain region 120 exposed from the patterned mask 122 without further removing any portion of the channel region 118 directly under the removed drain region 120, and consequently no step-height would be formed on the top surface of the channel region 118. Optionally, a doping process may be performed to further adjust the dopant concentration of the exposed channel region 118, and then the patterned mask 122 is removed.

Figure 3:
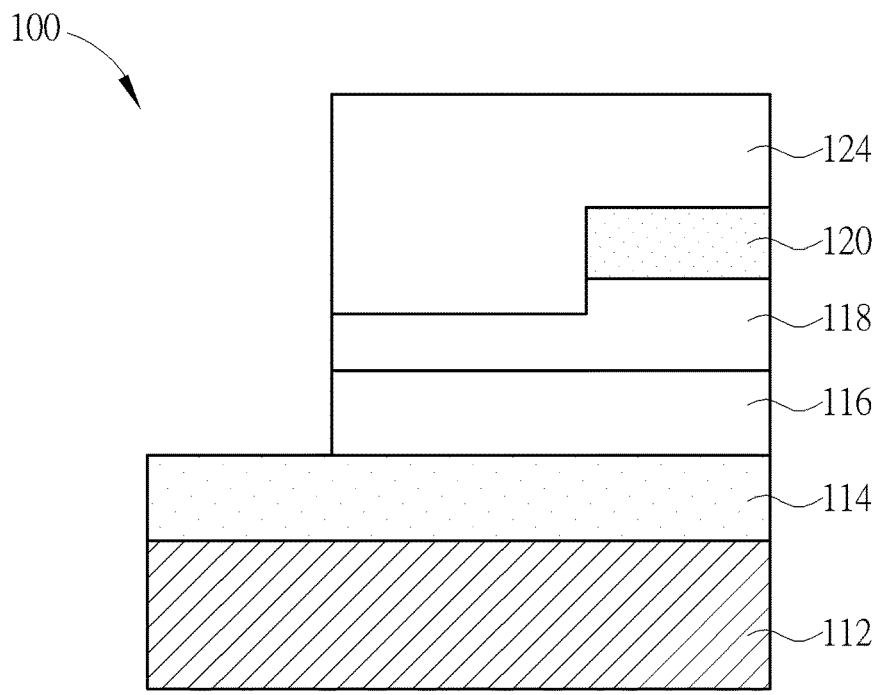
FIG. 3 is a cross-sectional diagram illustrating a TFET after the step of etching a tunneling layer of the TFET according to one embodiment of the present invention.

Please refer to FIG. 3, which is a cross-sectional diagram illustrating a TFET after the step of etching a tunneling layer of the TFET according to one embodiment of the present invention. After removing the pattern mask 122, another patterned mask 124, for example, a patterned photoresist, is formed on the channel region 118 and the drain region 120. Another etching process using the patterned mask 124 as an etching mask is then performed to etching away a portion of the channel region 118 and the tunneling region 115 exposed from the patterned mask 124 until a top surface of the source region 114 is exposed. Similarly, an optional doping process may be performed to further adjust the dopant concentration of the exposed source region 114, and then the patterned mask 124 is removed.

Figure 4:
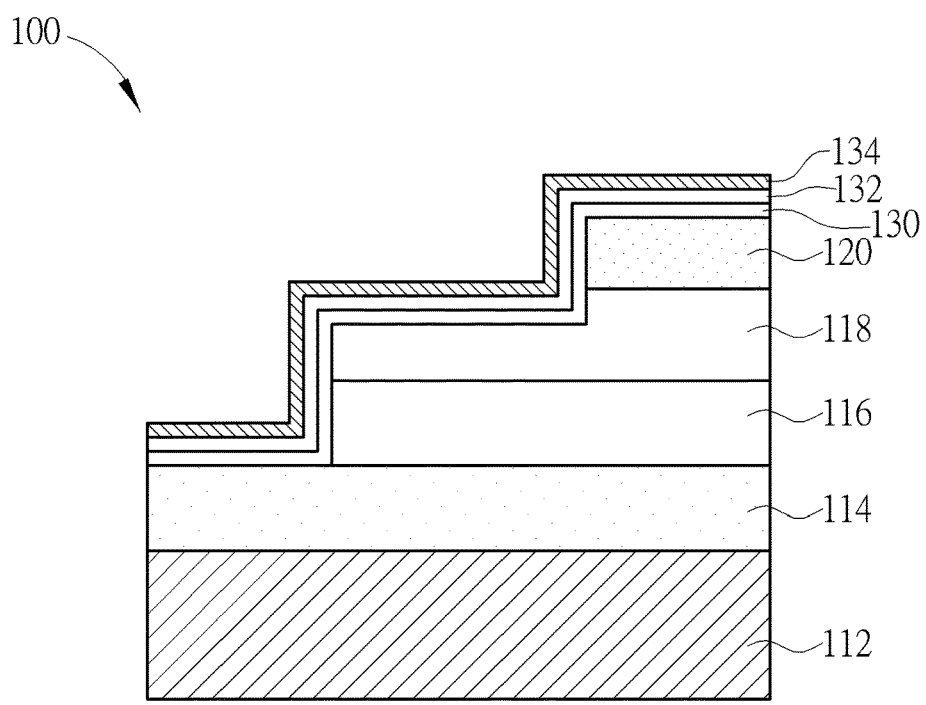
FIG. 4 is a cross-sectional diagram illustrating a TFET after the step of depositing a first metal layer of the TFET according to one embodiment of the present invention.

Please refer to FIG. 4, is a cross-sectional diagram illustrating a TFET after the step of depositing a first metal layer of the TFET according to one embodiment of the present invention. After patterning the drain region 120, the channel region 118 and the tunneling region 116 and exposing a portion of the source region 114, a gate dielectric layer 130, a bottom barrier layer 132 and a first metal layer 134 are successively formed conformally covering the top surface of the source region 114, the sidewall of the tunneling region 116, the sidewall and the top surface of the channel region 118, and the sidewall and the top surface of the drain region.

According to one embodiment, the gate dielectric layer 130 is a high-k dielectric layer. Preferably, the dielectric constant (k) of the gate dielectric layer 130 is larger than 20. The material of the gate dielectric layer 130 may be selected from a group comprising, but is not limited to, hafnium oxide (HfO2), hafnium silicon oxide (HfSiO2), hafnium silicon oxynitride (HfSiON), aluminum oxide (Al2O3), lanthanum oxide (La2O3), lanthanum aluminum oxide (LaAlO3), tantalum oxide (Ta2O3), zirconium oxide (ZrO2), zirconium silicon oxide (ZrSiO4), hafnium zirconium oxide (HfZrO4), strontium bismuth tantalate, (SrBi2Ta2O9, SBT), lead zirconate titanate (PbZrxTi1-xO3, PZT), barium strontium titanate (BaxSr1-xTiO3, BST) and other suitable rare-earth metal oxides. The bottom barrier layer 132 preferable comprises titanium nitride (TiN) and has a thickness, for example, larger than 20 angstroms. The first metal layer 134 preferably comprises titanium or aluminum, but is not limited thereto.

Figure 5:
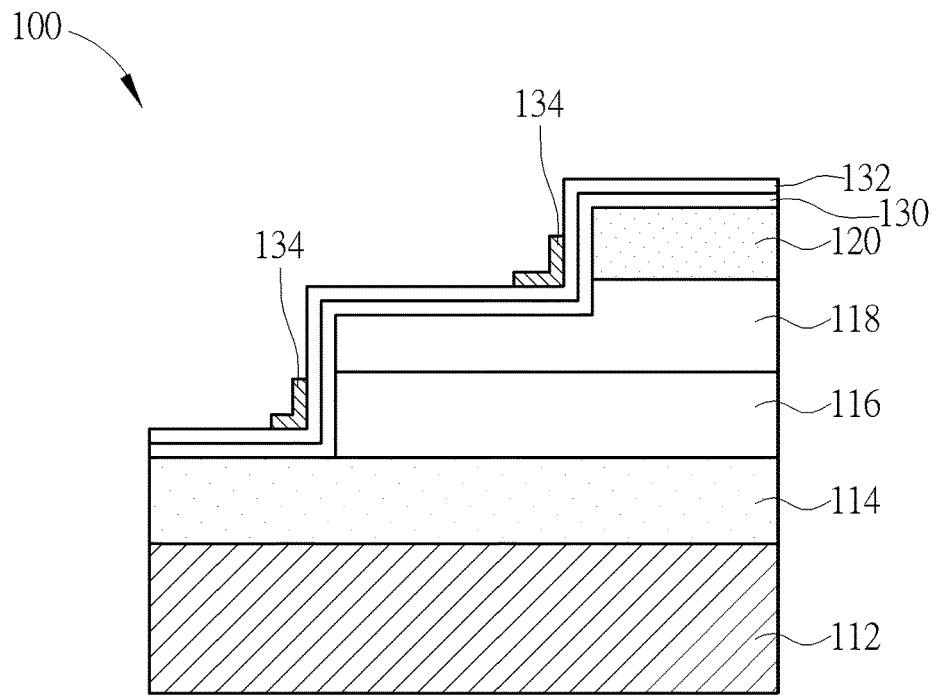
FIG. 5 is a cross-sectional diagram illustrating a TFET after the step of performing an anisotropic etching process to etch the first metal layer of the TFET according to one embodiment of the present invention.

Please refer to FIG. 5, which is a cross-sectional diagram illustrating a TFET after the step of performing an anisotropic etching process to etch the first metal layer of the TFET according to one embodiment of the present invention. After forming the gate dielectric layer 130, the bottom barrier layer 132 and the first metal layer 134, an anisotropic etching process is performed to etch the first metal layer 134 until the first metal layer 134 becomes discrete portions and exposes most of the underlying bottom barrier layer 132. It is one feature of the present invention that the removal rate of the first metal layer 134 in the corner regions are slower than other regions because that the etchants used in the anisotropic etching process have less possibility to get into the corner regions. As a result, a portion of the first metal layer 134 at the corner defined by the top surface of the source region 114 and the sidewall of the tunneling region 116 and another portion of the first metal layer 134 at the corner defined by the top surface channel region 118 and the sidewall of the drain region would remain after the anisotropic etching process. In other words, the contentious first metal layer 134 is patterned into discrete portions at each corner respectively without performing a conventional photolithography process. The process of patterning the first metal layer 134 may be regarded as a self-aligned patterning process.

Figure 6:
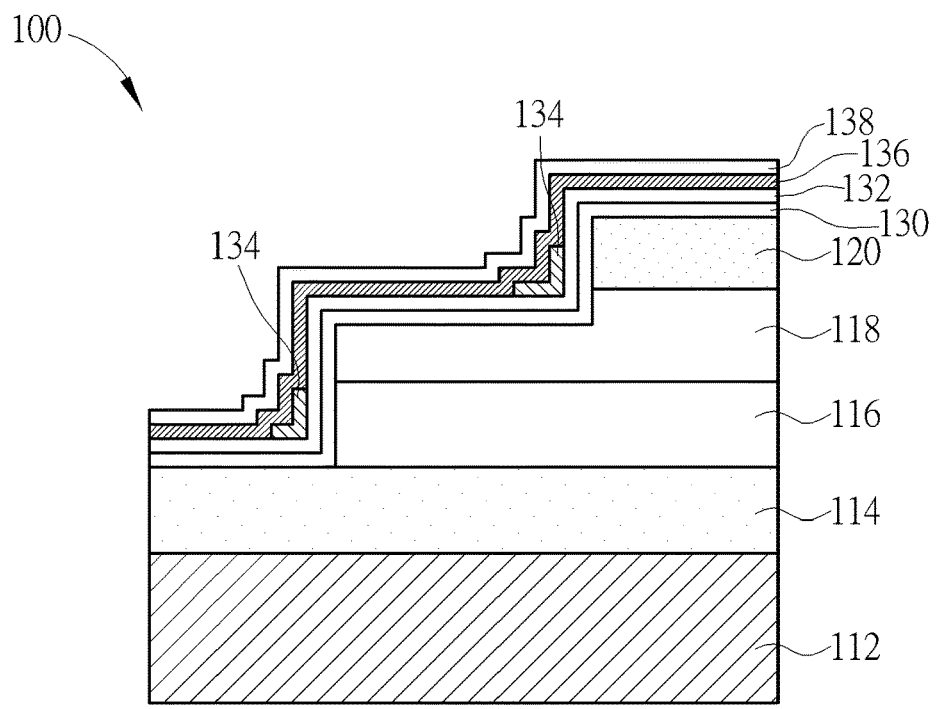
FIG. 6 is a cross-sectional diagram illustrating a TFET after the step of depositing a second metal layer of the TFET according to one embodiment of the present invention.

Please refer to FIG. 6, which is a cross-sectional diagram illustrating a TFET after the step of depositing a second metal layer of the TFET according to one embodiment of the present invention. After patterning the first metal layer 134, a second metal layer 136 and a top barrier layer 138 are successively and conformally formed on the bottom barrier layer 132 and the first metal layer 134. Preferably, the second metal layer 136 is in direct contact with the first metal layer 134. According to one embodiment, the composition of the second metal layer 136 is different from the composition of the first metal layer 134. For example, the first metal layer 134 may comprise aluminum (Al), and the second metal layer 136 may comprise titanium nitride (TiN). According to one embodiment, the top barrier layer 138 may comprise titanium nitride (TiN) having a thickness larger than 20 angstroms.

Figure 7:
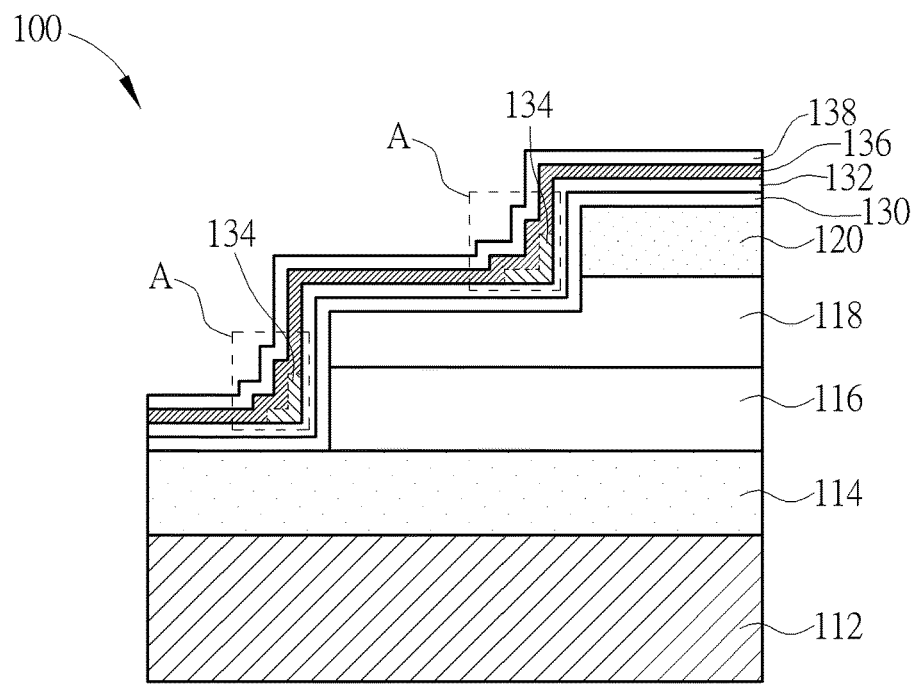
FIG. 7 is a cross-sectional diagram illustrating a TFET after the step of performing a thermal process according to one embodiment of the present invention.

Please refer to FIG. 7, which is a cross-sectional diagram illustrating a TFET after the step of performing a thermal process according to one embodiment of the present invention. After forming the second metal layer 136 and the top barrier layer 138, a thermal process is performed to diffuse the metal atoms of the first metal layer 134 into nearby second metal layer 136, or reversely diffuse the metal atoms of the second metal layer 136 into nearby first metal layer 134. The thermal process may be a thermal anneal process. According to one embodiment wherein the first metal layer 134 is made of aluminum and the second metal layer 136 is made of titanium nitride, the aluminum atoms of the first metal layer 134 in region A of the TFET are diffused into nearby second metal layer 136, and the titanium atoms of the second metal layer 136 are diffused into the underlying first metal layer 134 concurrently during the thermal process. After the thermal process, a TiAlN alloy made from the first metal layer 134 and the second metal layer 136 would be formed in region A of the TFET, as shown in FIG. 7.

Figure 8:
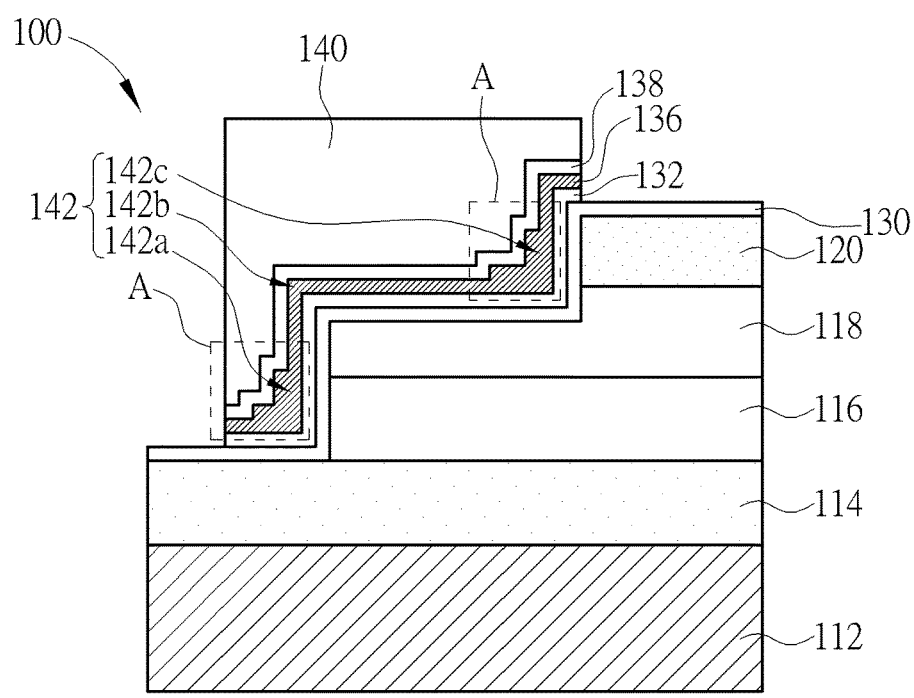
FIG. 8 is a cross-sectional diagram illustrating a TFET after the step of performing a patterning process according to one embodiment of the present invention.

Please refer to FIG. 8, which is a cross-sectional diagram illustrating a TFET after the step of performing a patterning process according to one embodiment of the present invention. After the thermal process shown in FIG. 7, a patterned mask 140, for example, a patterned photoresist is formed on the top barrier layer 138. An etching process using the patterned mask 140 as an etching mask is then performed to transfer the pattern of the patterned mask 140 to the top barrier layer 138 and the second metal layer 136. According to one embodiment, the etching process may also transfer the pattern of the patterned mask 140 to the bottom barrier layer 132 and the gate dielectric layer 130. The patterned mask 140 is removed after the etching process, and a vertical-type TFET 100 according to the embodiment of the present invention is obtained.

Please still refer to FIG. 8. The TFET 100 has a gate electrode 142 including at least a first gate electrode 142a, a second gate electrode 142b and a third gate electrode 142c. The first gate electrode 142a and the third gate electrode 142c in the two regions A of the TFET have the same composition because they are formed by thermal diffusion of the metal atoms of the first metal layer 134 and the second metal layer 136. On the other hand, the second gate electrode 142b would have a composition different from the compositions of the first gate electrode 142a and the third gate electrode 142c. According to one embodiment of the present invention, the first gate electrode 142a and the third gate electrode 142c have the same work function which is smaller than the work function of the second gate electrode 142b. For example, the first gate electrode 142a and the third gate electrode 142c have the same work function of 4.1 eV, and the second gate electrode 142b has a work function of 4.5 eV.

According to one embodiment of the present invention, the first gate electrode 142a and the third gate electrode 142c have gradient metal concentrations. More specifically, the first gate electrode 142a and the third gate electrode 142c comprise a particular kind of metal atoms in a concentration reducing gradually from their bottoms to their tops, and comprise another particular kind of metal atoms in a concentration increasing gradually from their bottoms to their tops. For example, according to one embodiment wherein the first metal layer 134 is made of aluminum and the second metal layer 136 is made of titanium nitride, the concentration of aluminum atoms reduces from the bottom to the top of the first gate electrode 142a and the third gate electrode 142c, and the concentration of titanium atoms increases from the bottom to the top of the first gate electrode 142a and the third gate electrode 142c.

Figure 9:
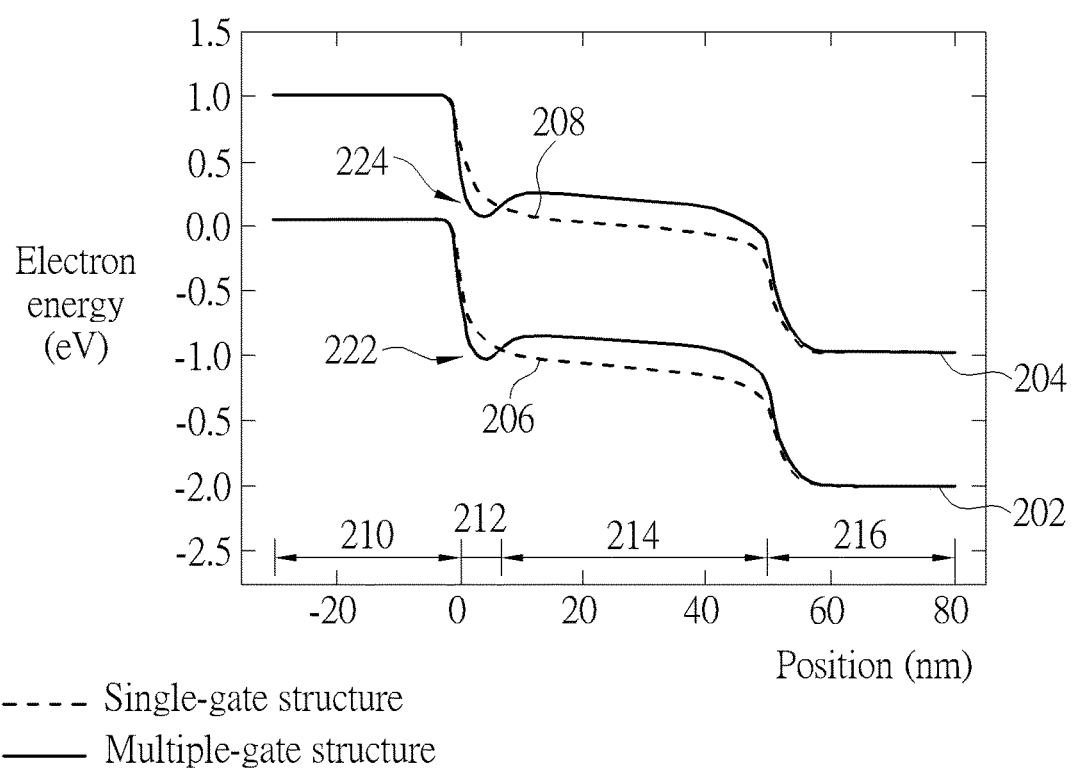
FIG. 9 is a band diagram illustrating the electron energy against various positions in a TFET according to one embodiment of the present invention.

Please refer to FIG. 9. FIG. 9 is a band diagram illustrating the electron energy against various positions of a TFET according to one embodiment of the present invention. Curves 202 and 204 are the electron energy of the valance band and the conduction band of a TFET having multiple gate structures according to the present invention. Curves 206 and 208 are electron energy of the valance band and the conduction band of a conventional TFET having a single gate structure. The regions 210, 212, 214 and 216 shown in FIG. 9 correspond to different positions of the TFET. More particularly, the region 210 corresponds to the source region 114 near the gate dielectric layer 130, the region 212 corresponds to the tunneling region 116 near the gate dielectric layer 130, the region 214 corresponds to the channel region 118 near the gate dielectric layer 130 and the region 216 corresponds to the drain region 120 near the gate dielectric layer 130. It is noticeable that, in FIG. 9, the curve 202 of the valance band and the curve 204 of the conduction-band of the TFET with multiple gate structures have protruding portions 222 and 224 in the region 212, respectively. On the contrary, the curve 206 of the valance band and the curve 208 of the conduction band of the conventional TFET with single gate structure have smooth profiles in the region 212 and do not have any protruding portion. It is concluded from the embodiments of the present invention that the protruding portions 222 and 224 of the curves 202 and 204 may result from the interaction between first gate electrode 142a formed in the region 212 and the second gate electrode 142b formed in the region 214. More specifically, the first gate electrode 142a having a work function smaller than that of the second gate electrode 142b lowers the electron energy of the valance band and conduction band near the interface between the region 210 (corresponding to source region 114) and the region 212 (corresponding to tunneling region 116), resulting in the protruding portions 222 and 224 of the curves 202 and 204. The protruding portion 224 allows the bottom of the conduction-band curve 204 in the region 212 closer to the valance-band curve 202 in the region 210. On the contrary, the conventional TFET having a single gate structure having a same composition and a same work function in all areas would have a conduction-band curve 208 in the region 212 farther from the valance-band curve 206 in the region 210. The shortened distance, that is, smaller band gap between the valance-band curve 202 and the conduction-band curve 204 in the interface between the region 210 and region 212 makes it easier for an electron to tunnel from the valance band of the source region 114 into the conduction band of the tunneling region. According to the embodiments of the present invention, when the TFET is at on-state while a sufficient gate bias is applied on the gate electrode, the electrons in the valance band of the source region would tunnel through the interface between the source region and the tunneling region into the conduction band of the tunneling region (that is, tunnel from the region 210 into the region 212) more readily. The on-current (Ion) of the TFET is therefore improved.

The first gate electrode 142a of the TFET according to the illustrated embodiment is formed closer to the interface between the source region 114 and the tunneling region 116 than the second gate electrode 142b. By forming the first gate electrode 142a having a work function smaller than that of the second gate electrode 142b, the lowest electron energy of the conduction band in the tunneling region 116 is lowered. When the TFET according to the present invention is at on-state, the electrons in the valance band of the source region 114 would tunnel through the interface between the source region 114 and the tunneling region 116 more readily, and the on-current (Ion) of the TFET 100 is improved accordingly.

Furthermore, the patterned first metal layer 134 is formed by performing an anisotropic etching process. The position of the first gate electrode 142a is determined by the position of the patterned first metal layer 134. Since the patterned first metal layer 134 is formed self-aligned with the interface between the source region 114 and the tunneling region 116, the position of the first gate electrode 142a may be better controlled.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a tunneling field effect transistor, comprising:
    providing a semiconductor substrate;
    forming a source region on the semiconductor substrate;
    forming a tunneling region on the source region, wherein the tunneling region comprises a sidewall and a top surface;
    forming a drain on the tunneling region;
    depositing a gate dielectric layer covering the sidewall and the top surface of the tunneling region;
    depositing a first metal layer covering the gate dielectric layer;
    performing an anisotropic etching process to remove a portion of the first metal layer to form non-continuous layers of the first metal layer on the sidewall and exposing the gate dielectric layer between two non-continuous layers of the first metal layer; and
    depositing a second metal layer directly covering the first metal layer and the gate dielectric layer after the step of performing an anisotropic etching process.

2. The method for forming a tunneling field effect transistor according to claim 1, wherein the first metal layer is a contentious layer conformally covering the gate dielectric layer before the anisotropic etching process.

3. The method for forming a tunneling field effect transistor according to claim 1, further comprising performing a thermal process after depositing the second metal layer so as to diffuse metal atoms of the first metal layer into the second metal layer.

4. The method for forming a tunneling field effect transistor according to claim 1, wherein the composition of the first metal layer is different from the composition of the second metal layer.

5. The method for forming a tunneling field effect transistor according to claim 1, wherein the source region is a heavily doped region having a first conductivity type, the tunneling region is a doped region having a second conductivity type, and the drain region is a heavily doped region having the first conductivity type.

6. The method for forming a tunneling field effect transistor according to claim 1, wherein the first conductivity type is P type and the second conductivity type is N type.

7. The method for forming a tunneling field effect transistor according to claim 1, wherein the source region, the tunneling region and the drain region are made of group III-V semiconductor compounds.

8. The method for forming a tunneling field effect transistor according to claim 1, further comprising forming a channel region between the tunneling region and the drain region, wherein the channel region and the tunneling region have the same conductivity type but have different dopant concentrations and/or dopant species.

* * * * *

UNITED STATES PATENT AND TRADEMARK OFFICE
CERTIFICATE OF CORRECTION

| | | |
|---|---|---|
| PATENT NO. | : 10,475,892 B2 | Page 1 of 1 |
| APPLICATION NO. | : 16/172851 | |
| DATED | : November 12, 2019 | |
| INVENTOR(S) | : An-Chi Liu et al. | |

It is certified that error appears in the above-identified patent and that said Letters Patent is hereby corrected as shown below:

On the Title Page

Add:
--(30) Foreign Application Priority Data
Jul. 12, 2017 (TW) ...............................106123341 A--.

Signed and Sealed this
Fourth Day of February, 2020

Andrei Iancu
*Director of the United States Patent and Trademark Office*